(12) United States Patent
Yamane et al.

(10) Patent No.: US 9,865,801 B1
(45) Date of Patent: Jan. 9, 2018

(54) INTEGRATED CIRCUITS WITH MAGNETIC TUNNEL JUNCTIONS AND METHODS FOR PRODUCING THE SAME

(71) Applicant: Globalfoundries Singapore Pte. Ltd., Singapore (SG)

(72) Inventors: Kazutaka Yamane, Singapore (SG); Vinayak Bharat Naik, Singapore (SG); Kangho Lee, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/410,088

(22) Filed: Jan. 19, 2017

(51) Int. Cl.
| | | |
|---|---|---|
| *H01L 43/12* | (2006.01) | |
| *H01L 43/02* | (2006.01) | |
| *H01L 43/08* | (2006.01) | |
| *H01L 27/22* | (2006.01) | |
| *H01L 43/10* | (2006.01) | |

(52) U.S. Cl.
CPC ............ *H01L 43/02* (2013.01); *H01L 27/226* (2013.01); *H01L 43/08* (2013.01); *H01L 43/10* (2013.01); *H01L 43/12* (2013.01)

(58) Field of Classification Search
CPC ...... H01L 43/12; H01L 27/222; H01L 27/224
See application file for complete search history.

(56) References Cited

U.S. PATENT DOCUMENTS

| | | | | |
|---|---|---|---|---|
| 8,871,365 | B2 * | 10/2014 | Wang | G11B 5/66 428/811 |
| 9,548,445 | B2 * | 1/2017 | Lee | H01L 43/12 |
| 9,627,609 | B2 * | 4/2017 | Jeong | H01L 43/12 |

* cited by examiner

*Primary Examiner* — Mark Prenty
(74) *Attorney, Agent, or Firm* — Lorenz & Kopf, LLP (57) ABSTRACT

Integrated circuits and methods of producing the same are provided. In an exemplary embodiment, a method of producing an integrated circuit includes forming a fixed layer that includes a magnetic material overlying a substrate. A non-magnetic first tunnel barrier layer is formed overlying the fixed layer. A total free layer is formed overlying the first tunnel barrier layer, where the total free layer includes a first spacer layer between first and second free layers. The first free layer includes one or more of cobalt, iron, and boron. The first spacer layer is non-magnetic and includes a first spacer layer boron sink material that has a boride formation enthalpy lower than the boride formation enthalpy of cobalt.

18 Claims, 5 Drawing Sheets

INTEGRATED CIRCUITS WITH MAGNETIC TUNNEL JUNCTIONS AND METHODS FOR PRODUCING THE SAME

TECHNICAL FIELD

The technical field generally relates to integrated circuits with perpendicular magnetic tunnel junctions (pMTJs or MTJs) and methods of producing the same, and more particularly relates to integrated circuits with pMTJs that are stable at elevated temperatures and methods of producing the same.

BACKGROUND

Magneto resistive Random Access Memory (MRAM) is an emerging technology that may be competitive with prior integrated circuit memory technologies, such as floating gate technology. The MRAM technology may integrate silicon-based electronic components with magnetic tunnel junction technology. A significant element in MRAM is the magnetic tunnel junction where information may be stored as memory. The magnetic tunnel junction stack (MTJ stack) has at least two magnetic layers separated by a non-magnetic tunnel barrier, where a first magnetic layer (the fixed layer) has a set magnetic property and a second magnetic layer (the free layer) has a programmable magnetic property. The MTJ can store information based upon the programmable state of the second magnetic layer. More particularly, if the fixed layer and the free layer have parallel magnetic poles, the resistance through the MTJ stack is measurably less than if the fixed layer and the free layer have anti-parallel poles, so parallel magnetic poles may be read as a "0" and anti-parallel poles may be read as a "1."

In some embodiments, the free layer may be pre-programmed before an integrated circuit is incorporated into a device. Incorporation of the integrated circuit into a device often involves a packaging reflow process that solders components at about 260 degrees Celsius (° C.). The stability of information in the free magnetic layer degrades as the temperature increases, and the magnetization of the free layer may become demagnetized if the temperature becomes too high (i.e., reaches the curie temperature for the free layer). Note that a permanent magnet generally becomes demagnetized if it is heated to its curie temperature or greater. An energy barrier (Eb) of the free layer should be sufficiently high at the packaging reflow process temperature to maintain magnetism so the stored information is not lost. For example, an energy barrier of about 40 $k_b T$ ($k_b$ is the boltzman constant times temperature, where $k_b$ is joules per degree Kelvin, and T is temperature in degrees Kelvin, so $k_b T$ is expressed in joules) or greater at the packaging reflow process temperature is generally sufficient to retain magnetism in the free layer so stored information is not lost. However, conventional MTJ stack designs that increase the overall energy barrier also increase the footprint of the MTJ stack, the power consumption, and decreases the endurance.

Accordingly, it is desirable to provide integrated circuits with magnetic tunnel junctions having a free layer with an energy barrier that is less sensitive to temperature increases than traditional magnetic tunnel junctions. In addition, it is desirable to provide integrated circuits with magnetic tunnel junctions that are temperature stable but have a free layer with a relatively low energy barrier at low temperatures such that desirable footprints and operations are possible, and methods of producing such integrated circuits. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods of producing the same are provided. In an exemplary embodiment, a method of producing an integrated circuit includes forming a fixed layer overlying a substrate, where the fixed layer includes a magnetic material. A first tunnel barrier layer is formed overlying the fixed layer, where the first tunnel barrier layer is non-magnetic. A total free layer is formed overlying the first tunnel barrier layer, where the total free layer includes a first free layer, a first spacer layer overlying the first free layer, and a second free layer overlying the first spacer layer. The first free layer includes one or more of cobalt, iron, and boron. The first spacer layer is non-magnetic and includes a first spacer layer boron sink material that has a boride formation enthalpy lower than the boride formation enthalpy of cobalt.

A method of producing an integrated circuit is provided in another embodiment. The method includes forming a fixed layer overlying a substrate, where the fixed layer includes a magnetic material. A first tunnel barrier layer is formed overlying the fixed layer, where the first tunnel barrier layer is non-magnetic. A total free layer is formed overlying the first tunnel barrier layer, where the total free layer includes a first free layer, a first spacer layer overlying the first free layer, and a second free layer overlying the first spacer layer. The first and second free layers include cobalt, iron, and boron, and the first spacer layer is non-magnetic. A second tunnel barrier layer is formed overlying the total free layer and includes magnesium oxide and a second tunnel barrier boron sink material. The second tunnel barrier boron sink material has a boride formation enthalpy that is lower than the boride formation enthalpy of cobalt. The integrated circuit is annealed, where a boron concentration in the second free layer decreases and a boride concentration in the second tunnel barrier layer increases during annealing.

An integrated circuit is provided in yet another embodiment. The integrated circuit includes a fixed layer that includes a magnetic material, and a first tunnel barrier layer overlying the fixed layer. The first tunnel barrier layer is non-magnetic. A total free layer overlies the first tunnel barrier layer, where the total free layer includes a first free layer, a second free layer, and a first spacer layer between the first and second free layers. The first and second free layers include cobalt and iron, and the first spacer layer includes a first spacer boron sink material. A boride formation enthalpy of the first spacer boron sink material is less than the boride formation enthalpy of cobalt.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

An integrated circuit includes a magnetic junction stack with a total free layer, where the total free layer includes a magnetic first free layer and a magnetic second free layer separated by a non-magnetic first spacer layer. The total free layer has a total free layer energy barrier that changes with temperature, where the total free layer energy barrier typically decreases with increasing temperatures. The total free layer also has a total free layer temperature coefficient that is the slope of the total free layer energy barrier plotted against the temperature. An increase in the total free layer temperature coefficient tends to produce an increased total free layer energy barrier value at higher temperatures, while allowing for designs with a lower total free layer energy barrier at lower temperatures. It has been discovered that increasing the crystallinity of the first and/or second free layers also increases the total free layer temperature coefficient. The first and second free layers are typically formed with cobalt/iron/boron compounds, and the boron tends to make the resulting first and second free layers more amorphous. As such, the magnetic tunnel junction is designed to diffuse boron from the first and/or second free layers during annealing into a boron sink material present in another layer. This increases the crystallinity of the first and/or second free layers and also increases the total free layer temperature coefficient. The diffusion of boron from the first and/or second free layer may allow for higher free layer crystallinity at lower anneal temperatures.

Figure 1:
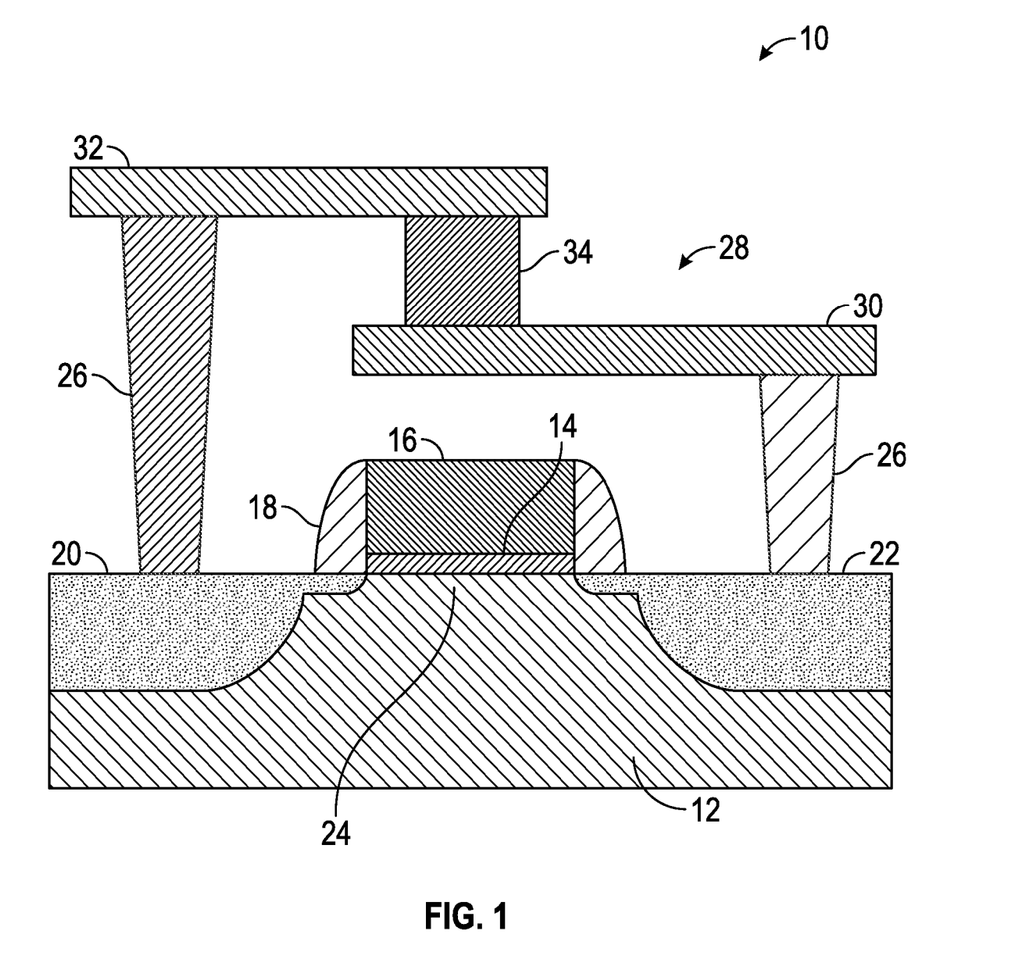
FIGS. 1-4 illustrate, in cross sectional views, an integrated circuit and methods for fabricating the same in accordance with exemplary embodiments.

Referring to an exemplary embodiment illustrated in FIG. 1, an integrated circuit 10 includes a substrate 12 formed of a semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that "includes" a recited material includes the recited material in an amount of at least 10 weight percent or more based on the total weight of the material unless otherwise indicated. In many embodiments, the substrate 12 primarily includes a monocrystalline semiconductor material. The substrate 12 may be a bulk silicon wafer (as illustrated) or may be a thin layer of silicon on an insulating layer (commonly known as silicon-on-insulator or SOI, not illustrated) that, in turn, is supported by a carrier wafer.

A gate insulator 14 overlies the substrate 12, and a gate 16 overlies the gate insulator 14. As used herein, the term "overlying" means "over" such that an intervening layer may lie between the gate insulator 14 and the substrate 12, or "on" such that the gate insulator 14 physically contacts the substrate 12. In an exemplary embodiment, the gate insulator 14 includes an electrically insulating material and the gate 16 includes an electrically conductive material. As used herein, an "electrically insulating material" is a material with a resistivity of about $1 \times 10^4$ ohm meters or more, an "electrically conductive material" is a material with a resistivity of about $1 \times 10^{-4}$ ohm meters or less, and an "electrically semiconductive material" is a material with a resistivity of from about more than $1 \times 10^{-4}$ ohm meters to less than about $1 \times 10^4$ ohm meters. For example, the gate insulator 14 may include silicon dioxide and the gate 16 may include polysilicon doped with conductivity determining impurities, but other materials may be used in alternate embodiments. Electrically insulating spacers 18 may overlie the substrate 12 adjacent to opposite sides of the gate insulator 14 and the gate 16. The spacers 18 may include silicon dioxide or other electrically insulating materials in various embodiments. A source 20 may be formed within the substrate 12 on one side of the gate 16, and a drain 22 may be formed within the substrate 12 on the opposite side of the gate 16. The source 20 and drain 22 include conductivity determining impurities (sometimes referred to as "dopants") at a higher concentration than in the substrate 12. FIG. 1 illustrates a planar transistor 28, where the transistor 28 includes the gate insulator 14, the gate 16, the spacers 18, the source 20, the drain 22, and a channel 24 disposed within the substrate 12 between the source 20 and drain 22 and underlying the gate 16. However, finned field effect transistors or other types of transistors may be used in alternate embodiments.

In the illustrated embodiment, a bottom electrode 30 is in electrical communication with the drain 22, and a top electrode 32 is in electrical communication with the source 20. A contact 26 may be used to electrically connect the source 20 and drain 22 with top and bottom electrodes 32, 30, respectively. The term "electrical communication," as used herein, means electrical current is capable of flowing from one component to another, where the electrical current may or may not flow through an electrically conductive intervening component. The term "direct electrical contact," as used herein, means direct physical contact between components that are electrically conductive or semiconductors, but not electrical insulators. A magnetic tunnel junction stack 34 (MTJ stack) is positioned between the bottom and top electrodes 30, 32, where the MTJ stack 34 is in electrical communication with the bottom and top electrodes 30, 32. In an exemplary embodiment, the bottom electrode 30 may serve as a word line, and the top electrode 32 may serve as a bit line, but other embodiments are also possible. The bottom and top electrodes 30, 32 may include several layers (not illustrated), such as a seed layer, a core, and a cover, and may include tantalum, tantalum nitride, nickel, copper, aluminum, or other electrically conductive materials. The MTJ stack 34 and the bottom and top electrodes 30, 32 may also be connected to other electronic components instead of the transistor 28 as illustrated, or in addition to the transistor 28 in various embodiments.

Figure 2:
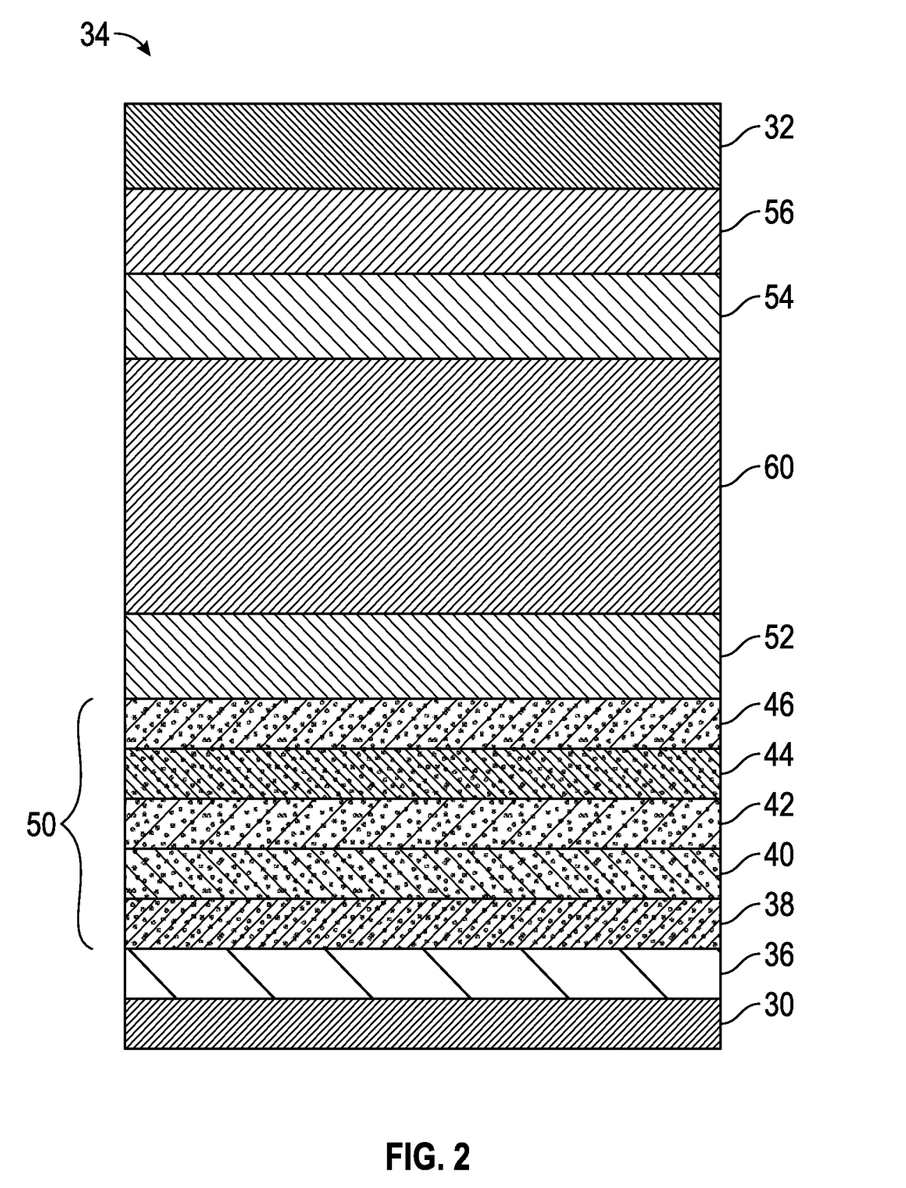

The MTJ stack 34 is illustrated in greater detail in FIG. 2. The MTJ stack 34 includes several layers overlying each other, where the illustrated layers may include sub-layers in some embodiments and where additional layers may also be present. In an exemplary embodiment, a seed layer 36 overlies the bottom electrode 30, a second hard metal layer 38 overlies the seed layer 36, a fixed divider layer 40 overlies the second hard metal layer 38, a first hard metal layer 42 overlies the fixed divider layer 40, a transition layer 44 overlies the first hard metal layer 42, and a reference layer 46 overlies the transition layer 44. A fixed layer 50 includes the second hard metal layer 38, the fixed divider layer 40, the first hard metal layer 42, the transition layer 44, and the reference layer 46. The first and second hard metal layers 42, 38 are magnetic, and the fixed divider layer 40 is non-magnetic. As used herein, a layer or material is "magnetic" if it is ferromagnet or a ferromagnetic material, where the term "ferromagnet" and "ferromagnetic" do not require the presence of iron. More particularly, a material is "magnetic" if it is a permanent magnet that retains its magnetic field after an induction magnetic field is removed, where the permanent magnet has a residual flux density of about 0.1 tesla or more. A layer or material is "non-magnetic" if it is a diamagnetic or a paramagnetic material, and more particularly does not form a permanent magnet or is only capable of forming a permanent magnet that has a residual flux density of less than about 0.1 tesla or less. A "permanent" magnet is a magnet that has residual flux density of about 0.1 tesla or more for at least about 1 week or more after being removed from an induction magnetic field. The transition layer 44 is nonmagnetic and the reference layer 46 is magnetic in an exemplary embodiment.

In an exemplary embodiment, the first and second hard metal layers 42, 38 include at least one at least one of cobalt, iron, platinum, or palladium. For example, the first and second hard metal layers 42, 38 may include one or more of cobalt iron compounds, cobalt iron boron compounds, cobalt platinum compounds, cobalt palladium compounds, iron platinum compounds, iron palladium compounds, and/or manganese platinum compounds. The fixed divider layer 40 primarily includes at least one of ruthenium, iridium, rhodium, chromium, nickel, or combinations thereof in exemplary embodiments. The transition layer 44 may primarily include at least one of tantalum, tungsten, molybdenum, or combinations thereof, and the reference layer 46 may primarily include cobalt, iron, and boron. However, other materials may be used in alternate embodiments. In an exemplary embodiment, all the layers of the MTJ stack 34 are formed by magnetron sputtering, by ion beam deposition, or other techniques using the materials of the layer being deposited, but other deposition techniques may also be used. The first and second hard metal layers 42, 38 may have the same composition as each other or different compositions in various embodiments.

A first tunnel barrier layer 52 is formed overlying the fixed layer 50, where the first tunnel barrier layer 52 includes magnesium oxide in an exemplary embodiment. The first tunnel barrier layer 52 may be from about 5 to about 20 angstroms thick in an exemplary embodiment. A total free layer 60 overlies the first tunnel barrier layer 52, and a second tunnel barrier layer 54 may overlie the total free layer 60. A capping layer 56 overlies the second tunnel barrier layer 54, and the top electrode 32 overlies the capping layer 56. The second tunnel barrier layer 54 is a nonmagnetic layer and may include magnesium oxide in an exemplary embodiment. The capping layer 56 is a nonmagnetic layer that may include tantalum, ruthenium, or other compounds. The total free layer 60 is described more fully below.

The second tunnel barrier layer 54 may optionally include a second tunnel barrier boron sink material in some embodiments. The second tunnel barrier boron sink material is a material with a boride formation enthalpy that is lower than the boride enthalpy formation for iron or cobalt. The "boride formation enthalpy," as used herein, may refer to the boride formation enthalpy for two reference atoms with a single boron atom ($R_2B$), or one reference atom with one boron atom (RB), or one reference atom with two boron atoms ($RB_2$), or for other configurations, as long as the same type of boride formation enthalpy is used when comparing different materials. The boride formation enthalpy for cobalt is lower than that of iron, and the second tunnel barrier boron sink material has a lower boride formation enthalpy than that of cobalt. Therefore, the second tunnel barrier boron sink material will form more stable boride compounds than cobalt (or iron), so any boron that may be present in the total free layer 60 and that migrates into the second tunnel barrier layer 54 will preferentially form a boride with the second tunnel barrier boron sink material (or other boron sink materials as described below) than with cobalt or iron. Therefore, as boron migrates into the second tunnel barrier layer 54 the boron (or boride) concentration in the total free layer 60 decreases while the boride concentration in the second tunnel barrier layer 54 increases. In an exemplary embodiment, the second tunnel barrier boron sink material may be one or more of titanium, vanadium, chromium, zirconium, niobium, molybdenum, hafnium, tantalum, tungsten, scandium, yttrium, and lanthanum, but other materials with a lower boride formation enthalpy may also be used. The second tunnel barrier layer 54 may include the second tunnel barrier boron sink material at a concentration of from about 10 to about 20 atomic percent, or from about 5 to about 50 atomic percent, or from about 1 to about 60 atomic percent in various embodiments.

Figure 3:
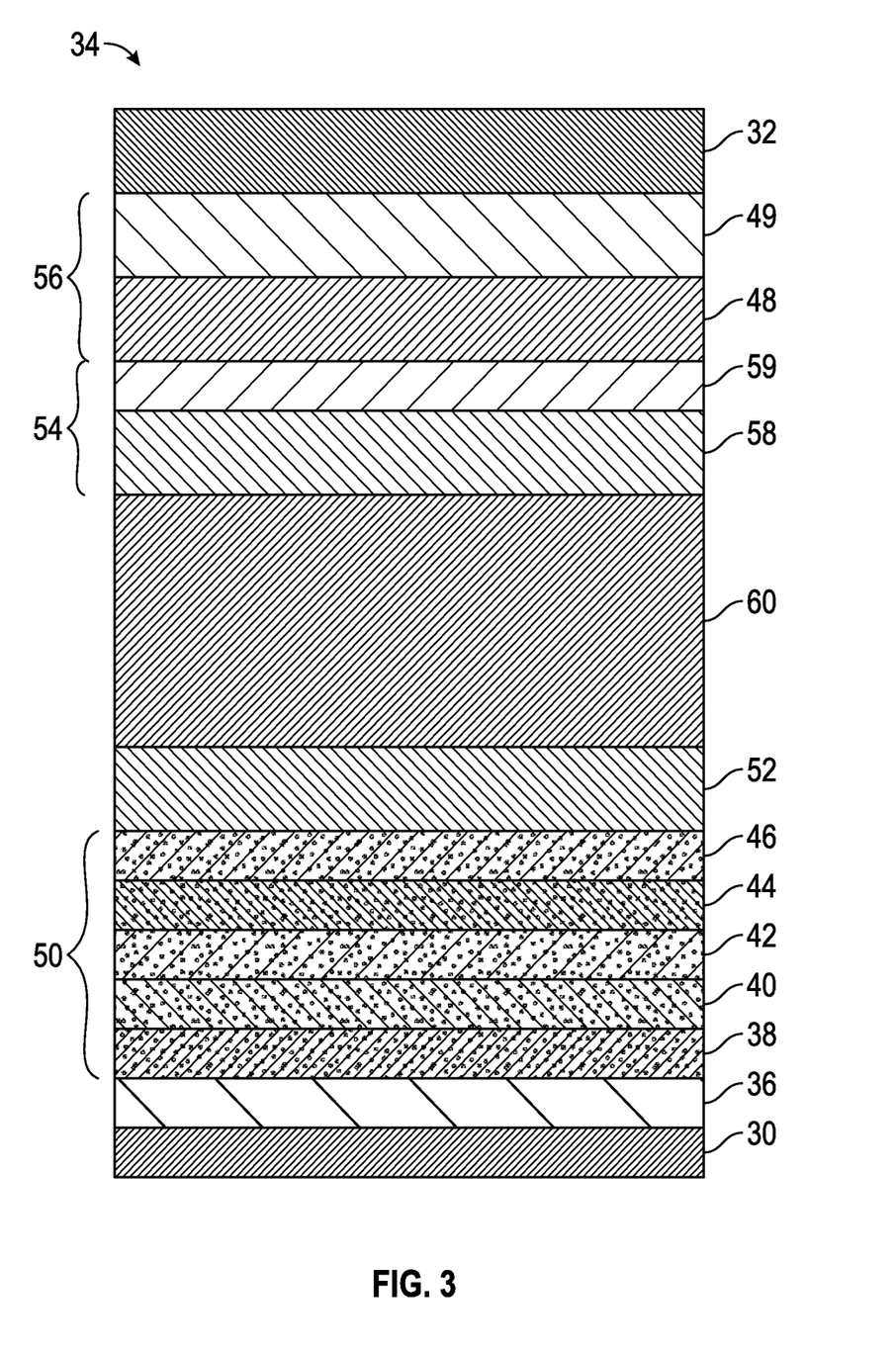

The second tunnel barrier boron sink material may be mixed throughout the second tunnel barrier layer 54, as illustrated in FIG. 2, or the second tunnel barrier boron sink material may be primarily present in a separate second tunnel barrier sink layer 58, as illustrated in an exemplary embodiment in FIG. 3. As such, the second tunnel barrier layer 54 may include a second tunnel barrier sink layer 58 and a second tunnel barrier oxide layer 59, as illustrated in FIG. 3, or the second tunnel barrier layer 54 may include a single tunnel barrier layer as illustrated in FIG. 2, where the second tunnel barrier boron sink material is intermixed with other materials in the second tunnel barrier layer 54. The second tunnel barrier layer 54 may also include a plurality of layers that are combined, such as two layers with varying concentrations of the second tunnel barrier boron sink material.

The capping layer 56 may include a capping layer boron reflective material that has a higher boride formation enthalpy than the boride formation enthalpy of iron. The boride formation enthalpy of iron is greater than that of cobalt, so the capping layer boron reflective material also has a higher boride formation enthalpy than that of cobalt. The capping layer boron reflective material tends to reduce or minimize the migration of boron into the capping layer 56 or other layers overlying the capping layer 56, so the materials of such layers are at least somewhat protected from boron migration. In an exemplary embodiment, the capping layer boron reflective material includes one or more of nickel, ruthenium, rhodium, palladium, iridium, silver, and gold, but other materials with boride formation enthalpies that are higher than that of iron may also be used. The capping layer boron reflective material may be present in the capping layer 56 at from about 0.1 to about 50 atomic percent, or from about 1 to about 30 atomic percent, or from about 5 to about 20 atomic percent in various embodiments. The capping layer boron reflective material may be intermixed in the capping layer 56, as illustrated in FIG. 2. In an alternate embodiment, the capping layer 56 may be divided into a capping reflective layer 48 that primarily includes the capping layer boron reflective material and a capping cover layer 49 that primarily includes non-magnetic materials other than the capping layer boron reflective material, as illustrated in FIG. 3.

Similar to the capping layer 56, the seed layer 36 may include a seed layer boron reflective material to reduce or limit boron migration into the seed layer 36 and other layers underlying the seed layer 36. The seed layer 36 reflective material has a higher boride formation enthalpy than that of cobalt, and may be present in the seed layer 36 at the same concentrations as described above for the capping layer 56. As with the capping layer boron reflective material, the seed layer boron reflective material may include one or more of nickel, ruthenium, rhodium, palladium, iridium, chromium, silver, and gold, but other materials with boride formation enthalpies that are higher than that of iron may also be used.

Figure 4:
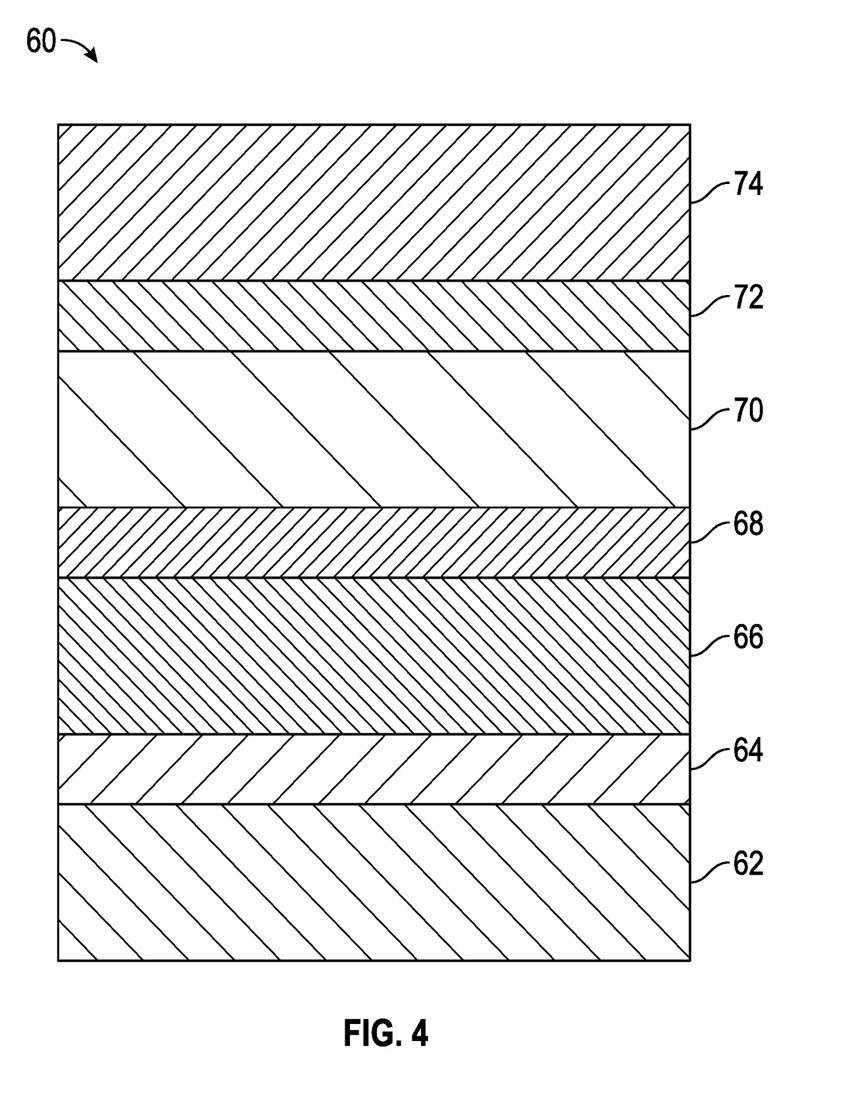

The total free layer 60 includes a plurality of individual free layers separated by spacer layers, as illustrated in an exemplary embodiment in FIG. 4 with continuing reference to FIG. 2. The total free layer 60 includes a first free layer 62 that is a magnetic layer and may be formed by depositing a cobalt iron boron compound. In alternate embodiments, the first free layer 62 may include one or more of cobalt, iron, or boron as either alloys or as multiple layers. A first spacer layer 64 overlies the first free layer, where the first spacer layer 64 is a nonmagnetic material. The first spacer layer 64 includes a first spacer boron sink material that has a lower boride formation enthalpy than that of cobalt. At the time of deposition, the first spacer boron sink material may be present in the first spacer layer 64 at an atomic percentage of from about 1 to about 40 percent, or from about 1 to about 70 percent, or from about 1 to about 100 percent in various embodiments. A second free layer 66 overlies the first spacer layer 64, where the second free layer 66 is a magnetic layer that is formed by depositing a cobalt iron boron compound. The total free layer 60 may be limited to only two individual free layers (i.e., the first and second free layers 62, 66), or the total free layer 60 may include three individual free layers, four individual free layers (as illustrated), or more individual free layers in various embodiments. Additional free layers may increase the exchange stiffness of the total free layer 60, which tends to reduce the temperature sensitivity of the total free layer 60. All of the layers in the MTJ stack 34 may be formed by sputtering, by ion beam deposition, or by other techniques, as mentioned above.

The total free layer 60 is annealed after formation, such as at a temperature of from about 300 to about 400° C., where the anneal may be performed after the entire MTJ stack 34 is formed. The total free layer 60 and the fixed layer 50 may be annealed to fix the magnetization direction in the various magnetic layers, where the magnetization direction may also be referred to as the easy axis direction in embodiments where the individual free layers are anisotropic. During annealing, the boron that is present in the first and second free layers 62, 66 (and other individual free layers) tends to migrate and form borides with materials that have lower boride formation enthalpies, as described above. As such, the concentration of boron in the first and second free layers 62, 66 (and any other free layers that may include boron) is reduced during annealing and the concentration of borides is increased in the first spacer layer 64 and any other spacer layers or adjoining layers that include boron sink materials. For example, in embodiments where the second tunnel barrier layer 54 includes the second tunnel barrier sink material, the boride concentration in the second tunnel barrier layer 54 increases during annealing.

Referring again to FIG. 4, a second spacer layer 68 may be formed overlying the second free layer 66, and a third free layer 70 may be formed overlying the second spacer layer 68. The second spacer layer 68 is non-magnetic and may include a second spacer boron sink material within the same concentration ranges described for the first spacer layer 64 above. In yet another embodiment, as illustrated in FIG. 4, a third spacer layer 72 is formed overlying the third free layer 70, and a fourth free layer 74 is formed overlying the third spacer layer 72. The third spacer layer 72 is non-magnetic and may include a third spacer boron sink material within the concentration ranges described above for the first spacer layer 64. As described above, the second and third spacer boron sink materials, if present, have a lower boride formation enthalpy than that of cobalt. The second and third spacer boron sink materials may be one or more of titanium, vanadium, chromium, zirconium, niobium, molybdenum, hafnium, tantalum, tungsten, scandium, yttrium, and lanthanum, but other materials may also be used. The third and fourth free layers 70, 74 are formed with a cobalt iron boron material, as described above for the other free layers, and additional layers may be added in yet further embodiments.

Boron tends to increase the amorphous character of a cobalt iron compound, so the first, second, third, and fourth free layers 62, 66, 70, 74 become more crystalline as the boron concentration is reduced. The use of the boron sink materials may modulate a required temperature of the anneal to produce a desired crystallinity of the individual free layers, where modulated anneal temperatures allow for broader material selection options for other integrated circuit components.

Figure 5:
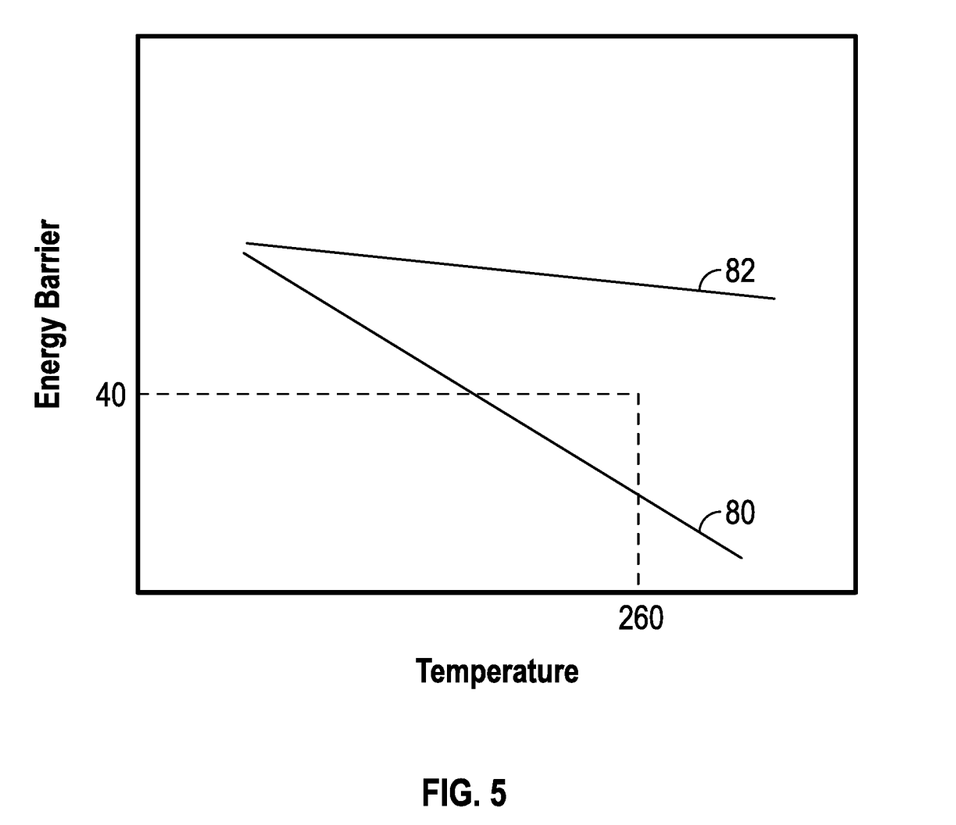
FIG. 5 illustrates a hypothetical graph depicting temperature vs. energy barrier for different embodiments of a total free layer.

Reference is made to FIG. 5, which is a hypothetical representation of the energy barrier of the total free layer 60 plotted against temperature, with continuing reference to FIGS. 1, 2, and 4. The first and second hard metal layers 42, 38 are generally formed from magnetic materials that have a curie temperature above packaging reflow process temperatures, so the first and second hard metal layers 42, 38 typically retain their magnetic properties during the packaging reflow process. A traditional line 80 illustrates an embodiment where the individual free layers (first free layer 62, second free layer 66, etc.) are more amorphous with higher boride concentrations, and a sink line 82 illustrates an embodiment where the individual free layers are more crystalline due to the presence of sink materials in the individual spacer layers (first spacer layer 64, second spacer layer 68, etc.)

The temperature coefficient of the total free layer 60 is produced from a combination of the temperature coefficients of the individual free layers, and the temperature coefficient is the slope of the line produced by plotting the energy barrier against temperature. As can be seen, the temperature coefficient is negative for the traditional line 80 and for the sink line 82, but the temperature coefficient is larger (less negative) for the sink line 82 than for the traditional line 80. The temperature coefficient of an individual free layer increases as the crystallinity increases, so the use of boron sink materials in the individual spacer layers increases the temperature coefficient of the total free layer 60, as illustrated by the sink line 82 representing individual spacer layers with sink materials. The use of the sink materials in one or more of the individual spacer layers may increase the temperature coefficient of the total free layer 60 enough that the energy barrier is greater than about $40 k_bT$ at a packaging reflow temperature of about 260° C., even when the energy barrier at a lower temperature is about the same or even less than for a similar magnetic tunnel junction stack 34 that does not include sink materials. As such, the use of sink materials in the MTJ stack 34 as described above may allow for relatively low energy barriers at low temperatures (such as about ambient temperatures, for example about 20 to about 30 degrees Celsius), while also producing an energy barrier above 40 $k_bT$ at about 260° C. In other words, the packaging reflow process may not increase the temperature of the total free layer 60 to the Curie temperature, so stored information can be retained during the packaging reflow process.

The MTJ stack 34 may be patterned into a desired shape for use as a memory cell (not illustrated) using photolithography and reactive ion etch techniques. The patterned MTJ stack 34 may then be further incorporated into an integrated circuit 10 in a wide variety of manners. For example, a plurality of MTJ stacks 34 may be connected to a plurality of transistors 28 to form a memory array.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
    forming a fixed layer overlying a substrate, wherein the fixed layer comprises a magnetic material;
    forming a first tunnel barrier layer overlying the fixed layer, wherein the first tunnel barrier layer is non-magnetic;
    forming a total free layer comprising a first free layer overlying the first tunnel barrier layer, wherein the first free layer comprises one or more of cobalt, iron, and boron, a first spacer layer overlying the first free layer, and a second free layer overlying the first spacer layer, wherein the first spacer layer is non-magnetic and comprises a first spacer boron sink material, wherein a boride formation enthalpy of the first spacer boron sink material is lower than the boride formation enthalpy of cobalt; and
    annealing the integrated circuit such that a boron concentration of the first free layer decreases and a boride concentration of the first spacer layer increases during the anneal.

2. The method of claim 1 wherein forming the first spacer layer comprises forming the first spacer layer wherein the first spacer boron sink material is present at a concentration of from about 1 to about 40 atomic percent.

3. The method of claim 1 further comprising:
    forming a second tunnel barrier layer overlying the total free layer.

4. The method of claim 3 wherein:
    forming the first tunnel barrier layer comprises forming the first tunnel barrier layer wherein the first tunnel barrier layer comprises magnesium oxide; and
    forming the second tunnel barrier layer comprises forming the second tunnel barrier layer wherein the second tunnel barrier layer comprises magnesium oxide.

5. The method of claim 3 further comprising:
    annealing the integrated circuit such that a boron concentration of the first free layer decreases and a boride concentration of the first spacer layer increases during the anneal;
    wherein forming the second tunnel barrier layer comprises forming the second tunnel barrier layer wherein the second tunnel barrier layer comprises a second tunnel barrier boron sink material, wherein the boride formation enthalpy of the second tunnel barrier boron sink material is less than the boride formation enthalpy of cobalt; and
    wherein annealing the integrated circuit comprises increasing the boride concentration in the second tunnel barrier layer.

6. The method of claim 5 wherein forming the second tunnel barrier layer comprises forming the second tunnel barrier layer comprising the second tunnel barrier boron sink material, where the second tunnel barrier boron sink material is one or more of titanium, vanadium, chromium, zirconium, niobium, molybdenum, hafnium, tantalum, tungsten, scandium, yttrium, and lanthanum.

7. The method of claim 1 further comprising:
    forming a capping layer overlying the total free layer, wherein the capping layer is non-magnetic, wherein the capping layer comprises a capping layer boron reflective material, wherein the boride formation enthalpy of the capping layer boron reflective material is greater than the boride formation enthalpy of iron.

8. The method of claim 7 wherein forming the capping layer comprises forming the capping layer wherein the capping layer boron reflective material is one or more of nickel, ruthenium, rhodium, palladium, iridium, silver, and gold.

9. The method of claim 1 wherein forming the first spacer layer comprises forming the first spacer layer wherein the first spacer boron sink material is one or more of titanium, vanadium, chromium, zirconium, niobium, molybdenum, hafnium, tantalum, tungsten, scandium, yttrium, and lanthanum.

10. The method of claim 1 wherein:
    forming the total free layer further comprises:
    forming a second spacer layer overlying the second free layer, wherein the second spacer layer is non-magnetic;
    forming a third free layer overlying the second spacer layer, wherein the third free layer comprises cobalt, iron, and boron; and
    wherein annealing the integrated circuit comprises reducing the boron concentration in the third free layer.

11. The method of claim 10 wherein:
    forming the second spacer layer comprises forming the second spacer layer wherein the second spacer layer comprises a second spacer boron sink material, wherein the boride formation enthalpy of the second spacer boron sink material is less than the boride formation enthalpy of cobalt; and
    annealing the integrated circuit comprises increasing the boride concentration in the second spacer layer.

12. The method of claim 11 wherein forming the total free layer further comprises:
    forming a third spacer layer overlying the third free layer, wherein the third spacer layer is non-magnetic; and
    forming a fourth free layer overlying the third spacer layer, wherein the fourth free layer comprises cobalt, iron, and born; and
    wherein annealing the integrated circuit comprises reducing the boron concentration in the fourth free layer.

13. The method of claim 12 wherein:
forming the third spacer layer comprises forming the third spacer layer wherein the third spacer layer comprises a third spacer boron sink material, wherein the boride formation enthalpy of the third spacer boron sink material is less than the boride formation enthalpy of cobalt; and
annealing the integrated circuit comprises increasing the boride concentration in the third spacer layer.

14. The method of claim 1 further comprising:
forming a seed layer underlying the fixed layer, wherein the seed layer is non-magnetic, wherein the seed layer comprises a seed layer boron reflective material, and wherein the boride formation enthalpy of the seed layer boron reflective material is greater than the boride formation enthalpy of iron.

15. The method of claim 14 wherein forming the seed layer comprises forming the seed layer wherein the seed layer boron reflective material is one or more of nickel, ruthenium, rhodium, palladium, iridium, chromium, silver, and gold.

16. The method of claim 1 wherein:
forming the fixed layer comprises forming a second hard metal layer that is magnetic, wherein the second hard metal layer comprises one or more of cobalt, iron, platinum, and palladium;
forming a fixed divider layer overlying the second hard metal layer, wherein the fixed divider layer is non-magnetic, and wherein the fixed divider layer comprises one or more of ruthenium, rhodium, iridium, nickel, and chromium; and
forming a first hard metal layer overlying the fixed divider layer, wherein the first hard metal layer is magnetic and comprises one or more of cobalt, iron, platinum, and palladium.

17. A method of producing an integrated circuit comprising:
forming a fixed layer overlying a substrate, wherein the fixed layer comprises a magnetic material;
forming a first tunnel barrier layer overlying the fixed layer, wherein the first tunnel barrier layer is non-magnetic;
forming a total free layer overlying the first tunnel barrier layer, wherein the total free layer comprises a first free layer, a first spacer layer overlying the first free layer, and a second free layer overlying the first spacer layer, wherein the first free layer comprises cobalt, iron, and boron, the second free layer comprises cobalt, iron, and boron, and the first spacer layer is non-magnetic;
forming a second tunnel barrier layer overlying the total free layer, wherein the second tunnel barrier layer comprises magnesium oxide and a second tunnel barrier boron sink material, wherein a boride formation enthalpy of the second tunnel barrier boron sink material is lower than the boride formation enthalpy of cobalt; and
annealing the integrated circuit, wherein a boron concentration in the second free layer decreases during the anneal and a boride concentration in the second tunnel barrier layer increases during the anneal.

18. The method of claim 17 further comprising:
forming a capping layer overlying the second tunnel barrier layer, wherein the capping layer comprises a capping layer boron reflective material, and wherein the boride formation enthalpy of the capping layer boron reflective material is greater than the boride formation enthalpy of iron.

\* \* \* \* \*